United States Patent [19]

Chang

[11] Patent Number: 5,534,718

[45] Date of Patent: Jul. 9, 1996

[54] LED PACKAGE STRUCTURE OF LED DISPLAY

[75] Inventor: Fa-Sheng Chang, Taipei Hsien, Taiwan

[73] Assignee: Hsi-Huang LIN, Taipel, Taiwan

[21] Appl. No.: 343,171

[22] Filed: Nov. 22, 1994

Related U.S. Application Data

[63] Continuation of Ser. No. 46,096, Apr. 12, 1993, abandoned.

[51] Int. Cl.$^6$ .............................. H01L 33/00; H01L 23/48
[52] U.S. Cl. .................. 257/98; 257/88; 257/99; 257/774; 361/788; 361/806; 362/297; 362/347; 362/800
[58] Field of Search ................... 257/79, 81, 82, 257/88, 91, 95, 99, 774, 676, 88, 98, 99; 361/788, 806; 362/297, 346, 347, 800

[56] References Cited

U.S. PATENT DOCUMENTS

| | | | |
|---|---|---|---|
| 3,764,862 | 10/1973 | Jankowski | 257/676 |
| 3,821,775 | 6/1974 | Biard | 257/98 |
| 3,914,786 | 10/1975 | Grossi | 257/676 |
| 3,956,667 | 5/1976 | Veith | 257/88 |
| 4,011,575 | 3/1977 | Groves | 257/99 |
| 4,013,915 | 3/1977 | Dufft | 257/99 |
| 4,375,606 | 3/1983 | DiLeo et al. | 257/676 |
| 4,485,377 | 11/1984 | Claus et al. | 257/99 |
| 4,920,404 | 4/1990 | Shrimazi et al. | 257/99 |
| 4,964,025 | 10/1990 | Smith | 257/88 |
| 5,019,746 | 5/1991 | Merg | 257/99 |
| 5,119,174 | 6/1992 | Chen | 257/98 |
| 5,187,547 | 2/1993 | Niina et al. | 257/77 |

FOREIGN PATENT DOCUMENTS

| | | | |
|---|---|---|---|
| 2285722 | 4/1976 | France | 257/99 |
| 55-123181 | 9/1980 | Japan | 257/99 |
| 3055888 | 3/1991 | Japan | 257/99 |
| 4000773 | 1/1992 | Japan | 257/99 |

OTHER PUBLICATIONS

IBM TDB vol. 10 No. 8 Jan. 1968 Visible Light Emitting Diode, p. 1120 Jacobus et al.

Primary Examiner—Rolf Hille
Assistant Examiner—David Ostrowski
Attorney, Agent, or Firm—Merchant, Gould, Smith, Edell, Welter & Schmidt

[57] ABSTRACT

An improved light emitting diode (LED) package structure for an LED lighting device comprises a reflector having a bowl-shaped reflecting surface formed by a pressing technique. A stand member extends from the center of the reflecting surface to the focus point of the reflector to support an LED die thereon. This arrangement allows the reflecting surface to extend toward the center thereof in order to increase the reflecting surface area and thus increasing the luminance of the LED display.

6 Claims, 7 Drawing Sheets

LED PACKAGE STRUCTURE OF LED DISPLAY

This is a continuation of application Ser. No. 08/046,096, filed Apr. 12, 1993, now abandoned.

FIELD OF THE INVENTION

The present invention relates to a light emitting diode (LED) lighting device, such as an LED lamp or a dot matrix LED display and in particular to the reflecting structure of the LED lighting device. The present invention is designed by means of the integrally-forming technique and the optical reflection theory to make the bowl-shaped reflecting surface of the LED lighting device perform optimum functions.

BACKGROUND OF THE INVENTION

Light emitting diodes are small dies with a size of approximate 0.3 mm which can only be clearly observed with a microscope. As shown in FIG. 6, wherein the general feature of an LED die is illustrated, the illumination areas of the LED are generated around a P-N junction 61 thereof and a-surface 62 which faces upward or outward. A connecting pad 63 is disposed on the surface 62 for electrical connection with a power source. To have all the light generated by the LED projected toward a same orientation, i.e., toward the upward or outward surface 62, it is desirable to provide a bowl-shaped reflector which comprises a recess having a reflecting surface, preferably a paraboloid, to surround the LED die. The reflecting surface is an essential element of an LED display in the point of view of projecting light in a given direction.

The LED lamp which is currently available in the market comprises a pair of metallic leads 71 and 72 as the connecting and supporting base thereof, as shown in FIG. 7. On one 71 of the frames, a bowl-shaped recess defining a reflecting surface 73 is formed. The LED die is placed on the bottom of the bowl-shaped reflecting surface 73. FIG. 8 is a partial cross-sectional view in a larger scale than FIG. 7, showing a portion of the lead on which the reflecting surface is formed. The location designated by the reference numeral 74 is where the LED die is placed. There is also a conductive wire 75 connecting between the LED die 74 and the other lead 72.

For a dot matrix LED display constituted by a number of LED dies, the arrangement is shown in FIG. 9 which comprises an upper cover 91 made of a plastic material having a plurality of smooth bowl-shaped recessed through holes 911 with a concave surface 912 respectively. The LED dies are disposed on the positions, indicated by the reference numbers 92, of the printed circuit board 93 which are respectively responsive to the bottoms of the bowl-shaped recessed through holes 911. When the upper cover 91 is assembled with the printed circuit board 93, each of the LED dies will protrude from the bottom of each of the bowl-shaped recessed through hole 911 and the concave surface 912 of the hole 911 will surround the LED die to serve as a reflection surface thereof.

One of the disadvantages of the above-discussed prior art LED lighting devices is that since the LED dies are disposed on the positions corresponding to the bottoms of the recessed through holes, the projection of the light emitted from the dies will be limited to the lower portion of the reflection surfaces 912 of the holes 911. This provides a less efficient light projection and thus making the LED device less illuminating. Therefore, the bowl-shaped reflection surfaces in the above-discuss cases fail to perform optimum functions.

Another commercially available LED display is constructed by directly soldering LED lamps as those 7 in FIG. 7 on a print circuit board 100 in the form of a matrix, as shown in FIG. 10. This arrangement is to replace the optically less efficient plastic reflecting surface of the conventional dot matrix LED displays as shown in FIG. 9 with the optically more efficient metallic reflecting surface of the LED lamps. The manufacturing process thereof, however, is much more complicated. Human labor is required to fix the LED lamps on the PCB one by one. Further, due to the interference of the electronic elements, such as integrated circuit chips, mounted on the same printed circuit board, the dipping soldering process may be incomplete. Besides, since the disposition of the LED lamps on the printed circuit is done by human labor, the disposition orientation of the LED lamps may not be consistent with each other so as to effect the illuminating quality thereof. Also, since only the LED lamp itself is encased by a resin enclosure, the soldering portion thereof with the printed circuit board is not enclosed and is not water-proof.

It is therefore desirable to provide an LED lamp lighting structure which can project light more efficiently than the prior art and it is also desirable to provide an dot matrix LED display which is constructed by applying the same optical principle so that a better illuminating efficiency can be achieved.

OBJECTS OF THE INVENTION

It is therefore an object of the present invention to provide an LED lighting device which overcomes the above-mentioned deficiency.

According to the optical theory, to perfectly project light with a reflector having a bowl-shaped reflecting surface, the reflecting surface thereof has to be a paraboloid and the light source should be placed at the focus point of the paraboloid. With reference to FIG. 11, if an LED die is placed on a plane BB' which is consistent with the focus point F, the light of the LED die reflected by the reflection surface will be best. Otherwise, the reflected light of the LED die when disposed on the plane AA' outside the plane BB' or the plane CC' inside the plane BB' will be worse. Currently, the commercially-available LED lighting device comprises a bottom side substantially coincident with the plane BB' which cut off the lower portion KLM of the paraboloid and thus cutting down the most effective reflecting surface area of the device. It is therefore desirable to improve the whole reflecting structure of the LED device, not just to change the location of the LED die or to change the material forming the reflecting surface, in order to further improve the light reflection efficiency.

Thus, in accordance with an aspect of the present invention, there is provided an LED lighting device which comprises a reflector having a bowl-shaped reflecting surface, preferably at least constituting a portion of a paraboloid, with a stand member extending from the center to the focus point thereof to support an LED die thereon so as to place the light source on the best location (the focus point) and to allow the reflecting surface to extend toward the center to provide a better and more complete reflecting surface. By applying this arrangement, it is understood that the bottom side of the lighting device is a plane substantially tangential to the center of the reflecting surface and the stand member brings the LED die away from the bottom side and placing it on the focus point.

DETAILED DESCRIPTION OF THE PREFERRED EMBODIMENTS

Figure 1:
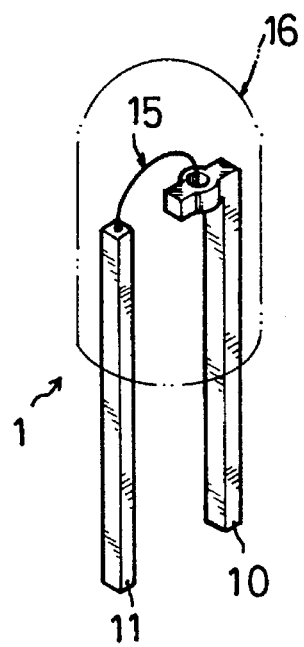
FIG. 1 is a perspective view showing an LED lamp construction accordance with the present invention.
Figure 11:
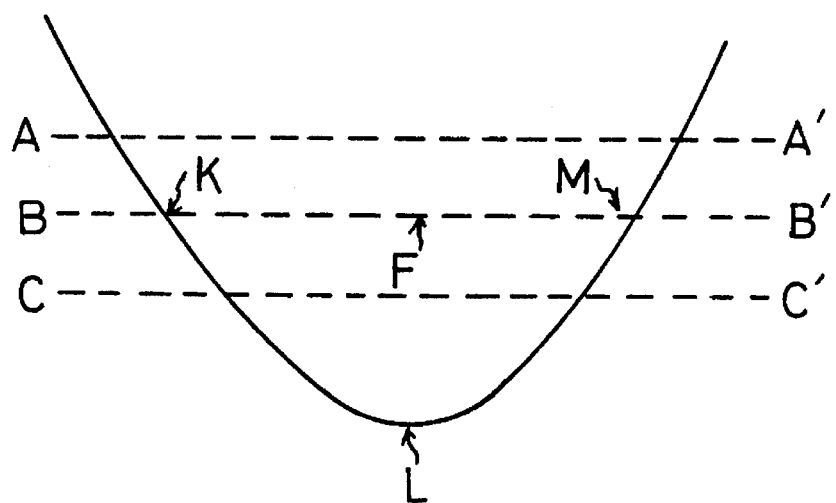
FIG. 11 is a schematic view showing the reflecting surface of LED lighting device.

With reference to FIG. 1, wherein an LED lamp 1 constructed in accordance with the present invention is shown, the LED lamp 1 comprises two metallic leads 10 and 11. One of the metallic leads, for example lead 10, has reflector means 12 integrally formed thereon by means of, for example a pressing technique. The reflector means 12 comprises a bowl-shaped concave reflecting surface 121, preferably a portion of a paraboloid in which defines a focus point F (see FIG. 11) along an optical axis extending from the center L (see FIG. 11) thereof. A stand member 13 is formed on the center L of the reflecting surface 12 and extending toward the focus point F to have a top end thereof on a location substantially coincident with the focus point F. Both the reflecting surface 12 and the stand member 13 may be formed simultaneously at the same pressing process. An LED die 14 is mounted on the top end of the stand member 13. The LED die 14 has a connector pad (not shown) mounted thereon for the electrical connection with a conductive lead 15 to another frame 11. The structure is then encased by a resin enclosure 16 with only the metallic frames 10 and 11 partially projecting out of the enclosure 16. The structure has the advantage of positioning the LED die 14 at the focus point F of the reflector means 12 by mounting the LED die 14 on the stand member 13 so that the reflecting surface 121 can extend further toward the position of the center L thereof to provide a more efficient reflecting surface and increasing the luminance of the LED lamp 1.

Figure 9:
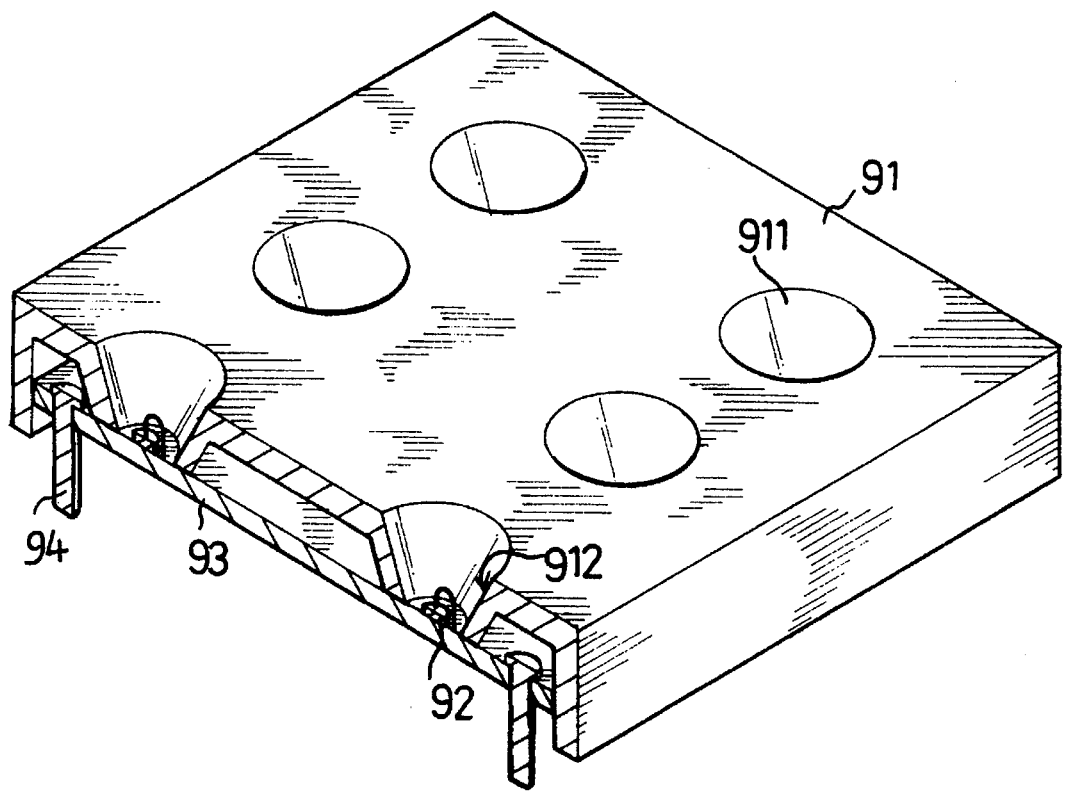
FIG. 9 is a perspective view of a prior art dot matrix type LED display, with a portion thereof being cut off to show the inside detail thereof.

This structure is also applicable to a dot matrix LED display which is disposed on a PCB base. Conventionally, the dot matrix LED display has a rivet extending out therefrom, such as that 94 shown in FIG. 9, just for electric connecting to a mother board of the display system. These rivets are for connecting purpose only. In accordance with an aspect of the present invention, the rivets will be modified to serve as LED die supporting means.

Figure 3:
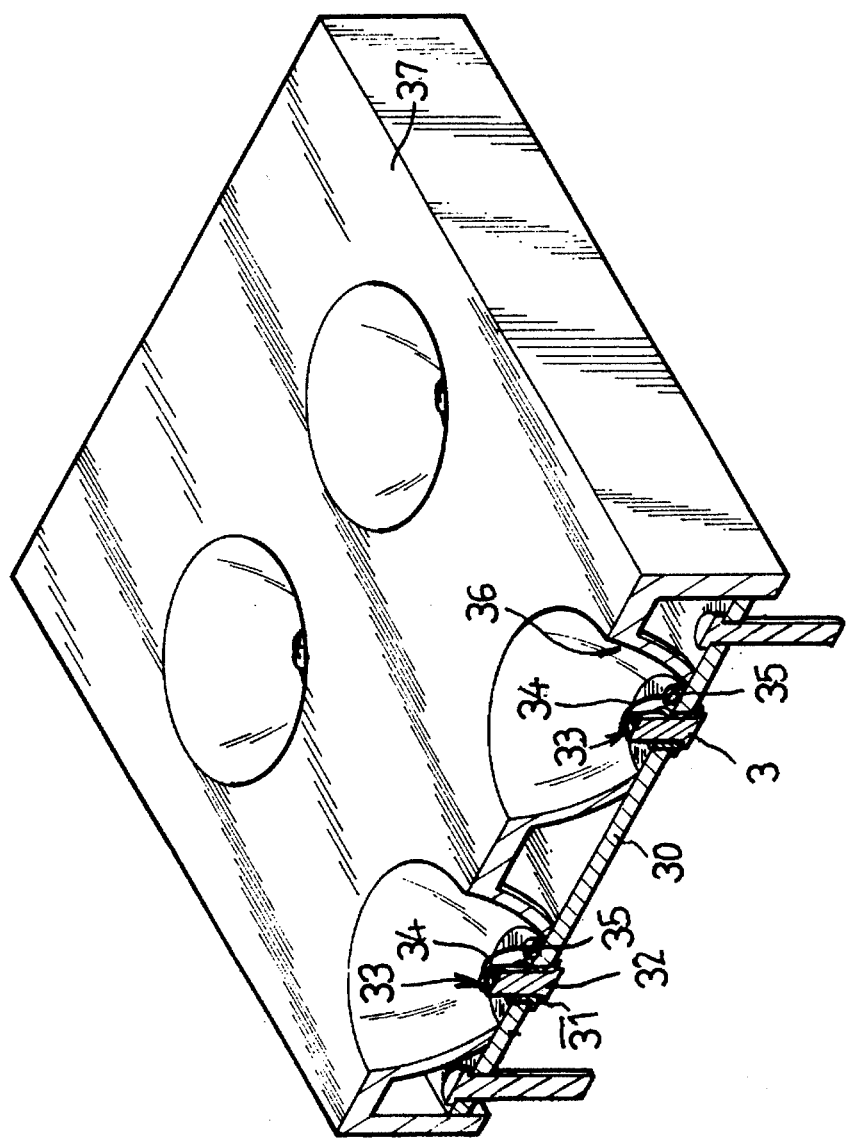
FIG. 3 is a perspective view of a dot matrix type LED display constructed in accordance with the present invention, with a portion thereof being cut off to show the inside detail thereof.

FIG. 3 shows a perspective view of a dot matrix LED display constructed in accordance with the present invention. The PCB 30 is first formed with a plurality of through holes 31 corresponding to the locations where the LED dies 33 are to be mounted. A metal rivet (which is hereinafter referred to as boss member) 32 is inserted into each of the through holes 31 and secured thereon to support each of the LED dies 33 on the top end thereof. A conductive lead 34 is then connected between the connector layer of each of the LED dies 33 and an electrically opposite polarity zone 35. Reflector means 37 which also serves as a cover member with a plurality of bowl-shaped through holes formed thereon to define a plurality of bowl-shaped reflecting surfaces 36, corresponding to the LED dies 33, is mounted on the PCB 30 to allow the boss members 32 and the LED dies 33 to be respectively inserted into the through holes of the cover member 37 and thus surrounded by the bowl-shaped reflecting surfaces 36.

Figure 4:
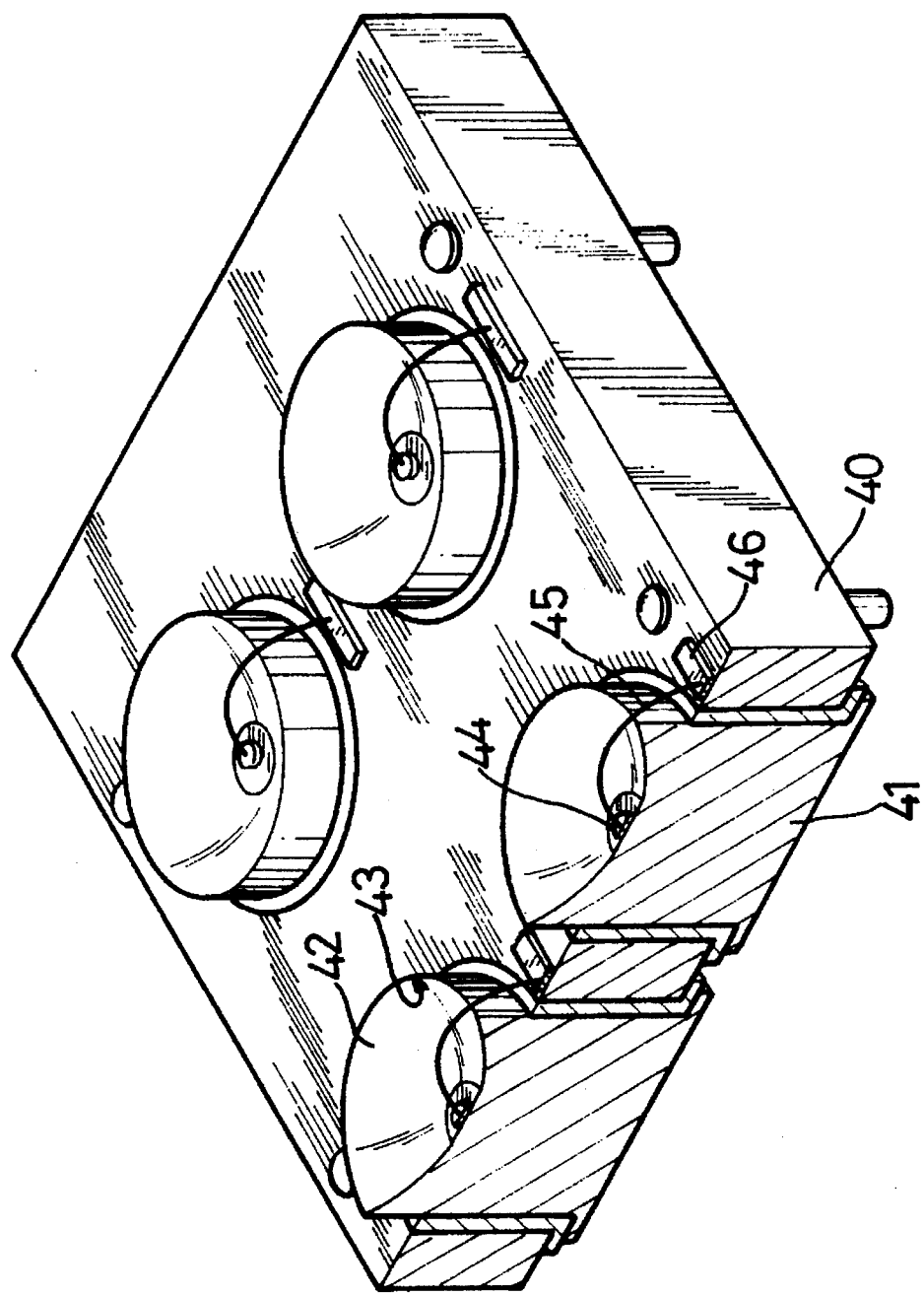
FIG. 4 is a view similar to FIG. 3 but showing another embodiment of the dot matrix LED display constructed in accordance with the present invention.
Figure 5:
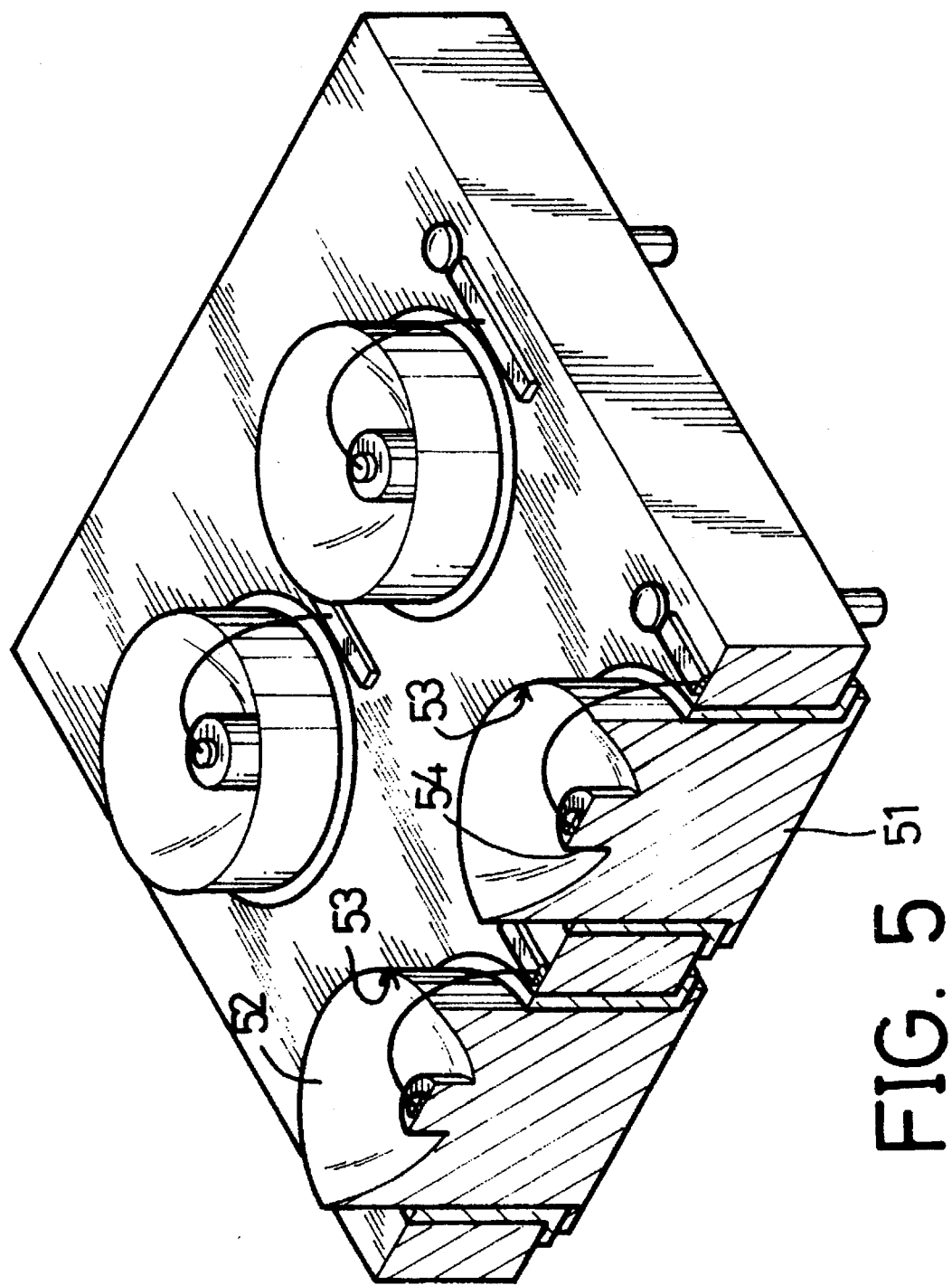
FIG. 5 is a view similar to FIGS. 3 and 4, but showing a further embodiment of the dot matrix LED display constructed in accordance with the present invention.
Figure 6:
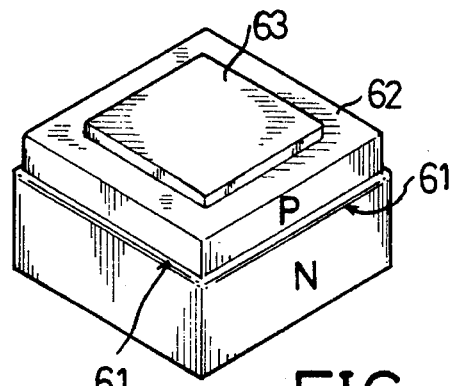
FIG. 6 shows the general feature of an LED die.
Figure 7:
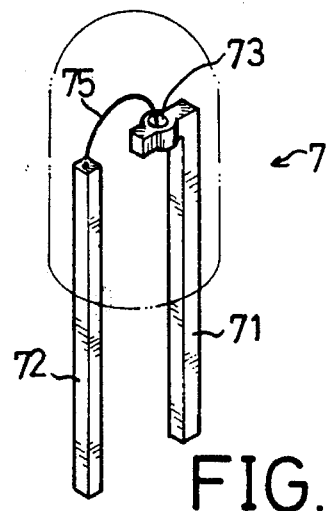
FIG. 7 is a perspective view showing a prior art LED lamp.
Figure 8:
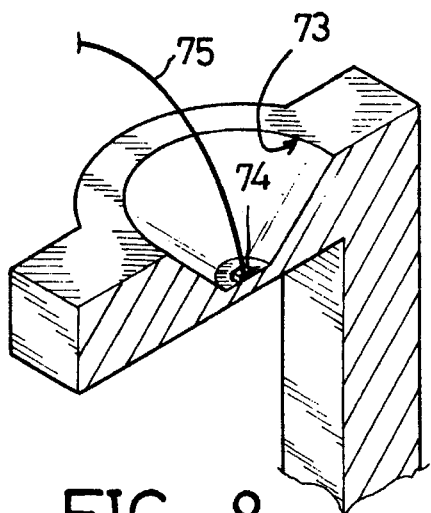
FIG. 8 is a cross-sectional view, in a larger scale, showing a portion of the prior art LED lamp of FIG. 7.

If the boss members 32 are made of an extendable material, such as conductive metals, which can be pressed to undergo deformation, then it is possible to form a bowl-shaped recess on the top of the boss member 32 by the pressing technique, as those shown in the embodiments of FIGS. 4 and 5. In the embodiment of FIG. 4 (to illustrate the present invention in different embodiments, the same elements of FIGS. 3–5 are numbered by different reference numbers), a bowl-shaped recess 42 which defines a reflecting surface 43 is directly formed on the top of a boss member 41 which is inserted through and secured on a PCB 40. This can provide a saving in the manufacturing and mounting of the cover member as discussed in FIG. 9. The LED die 44 is then mounted in the bottom of the recess 42 and a lead 45 is connected between the LED die 44 and an electrically opposite polarity zone 46. Finally, the whole construction including the PCB 40 and the boss member 41 is sealed together by resin via a molding technique.

Figure 10:
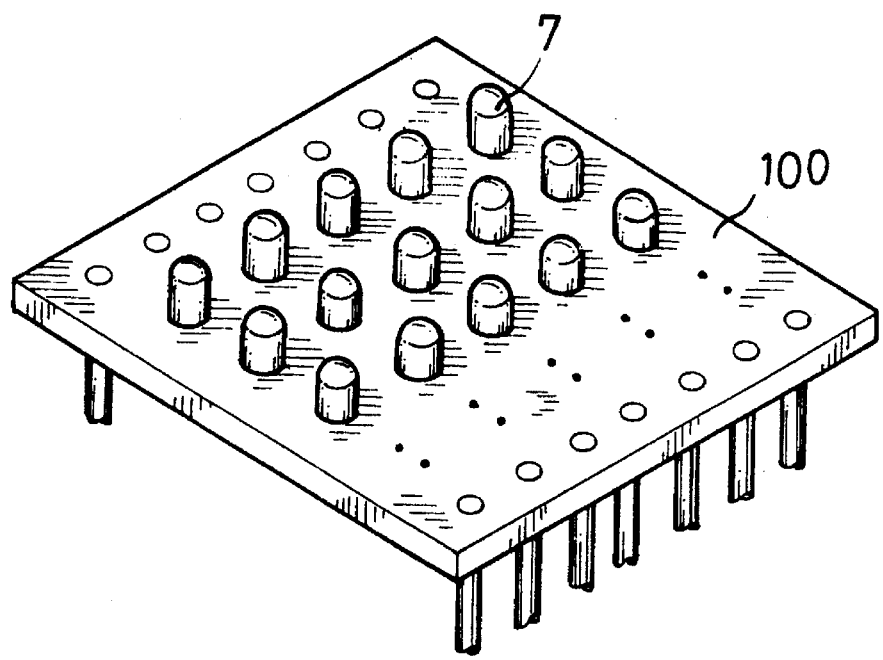
FIG. 10 is a perspective view showing a prior art dot matrix type LED display constituted by a plurality of LED lamps soldered directly on a circuit board.

The embodiment discussed with reference to FIG. 4 not only provides a saving in the cost for manufacturing and mounting the cover member, but also provides a metallic reflecting surface which, as compared with the plastic reflecting surface of the conventional dot matrix LED display, is much better in surface smoothness and thus reflection characteristic. The metallic reflecting surface also provides a better heat dissipation characteristic as compared with the plastic reflecting surface. This leads in a better luminous and a longer service life of the LED lighting device. Besides, no human labor is required to fix the LED lamps on the PCB and the water-proof problem in the end products as mentioned in FIG. 10 is solved by this embodiment which surely cuts down the number of defect products. Although in the embodiment of FIG. 4, the installation of the dies does not follow the optical theory as mentioned in FIG. 11, the configuration of the dot matrix LED display of FIG. 4 and the functions provided therefrom are novel and advantageous over the prior art. It is therefore deemed that the embodiment of FIG. 4 is creative and obviously different from the well-known dot matrix LED display.

Figure 2:
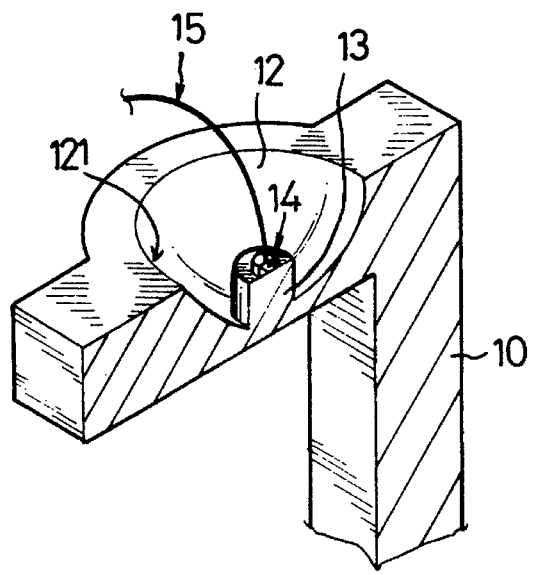
FIG. 2 is a cross-sectional view, in a larger scale, shown a portion of the LED lamp of FIG. 1.

It is also possible to form a stand member in the bowl-shaped recess, as that shown in FIG. 5. In the embodiment shown in FIG. 5, the metallic boss member 51 has a bowl-shaped recess 52 which defines a bowl-shaped reflecting surface 53 formed thereon and a stand member 54 formed inside the recess 52 and extended upperwardly from the bottom of the recess 52. Besides the advantages discussed with reference to the embodiment of FIG. 4, the embodiment of FIG. 5 also provides a more complete reflecting surface just like that discussed with the embodiment associated with FIG. 2.

In view of the above, the characteristics of the present invention is to construct the reflection surface and the stand member by means of the integrally forming pressing technique so that the cost of manufacturing and mounting the cover means can be reduced and the quality of the LED lamps or the dot matrix LED display can be largely improved. It is apparent that although the invention has been described in connection with preferred embodiments, those skilled in the art may make changes to certain features of the preferred embodiments without departing from the spirit and scope of the invention as defined in the appended claims.

What is claimed is:

1. A light emitting diode display, comprising:

a printed circuit board having a plurality of through-holes formed therein, said through-holes having electrically conductive materials placed on an inner surface of said through-holes;

a plurality of electrically conductive members, each of said electrically conductive members being fixed in and electrically connected with a corresponding one of said plurality of through-holes of said printed circuit board and providing electrical connection for both sides of said printed circuit board;

an end of each of said electrically conductive members having a bowl-shaped recess formed thereon defining a bowl-shaped reflecting surface;

said bowl-shaped reflecting surface having a bottom center and a focus point along an optical axis of said bowl-shaped reflecting surface;

a light emitting diode die being mounted on the bottom center of said bowl-shaped reflecting surface; and a conductive lead being electrically connected between the light emitting diode die and an electrically opposite polarity zone of the printed circuit board.

2. A light emitting diode display as claimed in claim 1, further comprising a plurality of stand members, each of said plurality of stand members is integrally formed with and positioned on the bottom center of said bowl-shaped reflecting surface for supporting the light emitting diode die at said focus point so as to increase luminance of the light emitting diode display.

3. A light emitting diode display as claimed in claim 1, wherein each of said electrically conductive member is a rivet.

4. A light emitting diode display as claimed in claim 1, further comprising a plurality of stand members, each of said plurality of stand members is integrally formed with and positioned on the bottom center of said bowl-shaped reflecting surface for supporting the light emitting diode die at said focus point so as to increase luminance of the light emitting diode display.

5. A light emitting diode display, comprising:

a holding body having a plurality of through-holes formed therein, said through-holes having electrically conductive materials placed on an inner surface of said through-holes;

a plurality of electrically conductive members, each of said electrically conductive members being fixed in and electrically connected with a corresponding one of said plurality of through-holes of said holding body and providing electrical connection for both sides of said holding body;

an end of each of said electrically conductive members having a bowl-shaped recess formed thereon defining a bowl-shaped reflecting surface;

said bowl-shaped reflecting surface having a bottom center and a focus point along an optical axis of said bowl-shaped reflecting surface;

a light emitting diode die being mounted on the bottom center of said bowl-shaped reflecting surface; and a conductive lead being electrically connected between the light emitting diode die and an electrically opposite polarity zone of the holding body.

6. A light emitting diode display as claimed in claim 5, wherein each of said electrically conductive member is a rivet.

* * * * *